US008856716B1

(12) United States Patent
Huang et al.

(10) Patent No.: US 8,856,716 B1
(45) Date of Patent: Oct. 7, 2014

(54) AUTOMATIC PLACEMENT SYSTEM OF IC DESIGN AND METHOD THEREOF

(71) Applicant: National Taiwan University, Taipei (TW)

(72) Inventors: Han-Pang Huang, Taipei (TW); Ming-Hui Chang, Taipei (TW); Che-Hsin Cheng, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 14/027,830

(22) Filed: Sep. 16, 2013

(30) Foreign Application Priority Data

May 24, 2013 (TW) .............................. 102118496 A

(51) Int. Cl.
*G06F 17/50* (2006.01)
(52) U.S. Cl.
CPC .................................. *G06F 17/5072* (2013.01)
USPC ........... 716/123; 716/118; 716/119; 716/132; 716/135

(58) Field of Classification Search
USPC ........................................................ 716/123
See application file for complete search history.

(56) References Cited

U.S. PATENT DOCUMENTS 6,493,658 B1 * 12/2002 Koford et al. ..................... 703/1
2008/0250383 A1 * 10/2008 Tanaka et al. .................. 716/21

* cited by examiner

*Primary Examiner* — Vuthe Siek
*Assistant Examiner* — Eric Lee
(74) *Attorney, Agent, or Firm* — Muncy, Geissler, Olds & Lowe, P.C.

(57) ABSTRACT

An automatic placement system of IC design and a method thereof is provided. The automatic placement system of IC design concerns the chip area utility ratio, the input-output relationship between components, the power consumption produced from thermal noise of circuits and the MOS-type transformation ratio, and performs the genetic algorithm for providing an optimal solution to the placement problem. Herewith the effect of optimizing the placement according to the data of components and parameter is achieved.

9 Claims, 11 Drawing Sheets

AUTOMATIC PLACEMENT SYSTEM OF IC DESIGN AND METHOD THEREOF

CROSS-REFERENCE TO RELATED APPLICATION

This application claims the benefit of Taiwan Patent Application No. 102118496, filed on May 24, 2013, in the Taiwan Intellectual Property Office, the disclosure of which is incorporated herein its entirety by reference.

BACKGROUND OF THE INVENTION

1. Field of the Invention

The present invention generally relates to an automatic placement system of IC design and a method thereof, in particular to an automatic placement system of IC design and a method thereof that use a genetic algorithm to achieve an optimal placement according to different component data and parameters.

2. Description of the Related Art

As to circuit products, the placement of circuit components is a task highly relied on the experience and professional skills of designers and having a significant effect on the finished products. Since many factors have to be taken into consideration for the placement of circuit components, the designers generally use an automatic placement system to assist the design of the placement of the circuit components to improve their working efficiency.

However, the conventional automatic placement systems perform the placement by a computed placement method and still have the drawbacks of a chip with a too-large area, a circuit component with too much generated heat, and a noise interference so that the circuit placement performance is poor, and the time taken for computing the placement method is too long, and thus they cannot meet the design requirements. Therefore, the applications of the conventional automatic placement systems have significant limitations, and they become a major issue for related manufacturers to overcome.

In view of the aforementioned problems, the inventor of the present invention based on experiences in the related industry to conduct extensive researches and experiments, and finally designed an automatic placement system of IC design and a method thereof to overcome the drawbacks of the prior art and improved industrial applications.

SUMMARY OF THE INVENTION

Therefore, it is a primary objective of the present invention to provide an automatic placement system of IC design and a method thereof to overcome the drawbacks of the prior art having a too-large chip area, a too-hot circuit component and a noise interference resulted from the layout performed by the automatic placement system.

To achieve the foregoing objective, the present invention provides an automatic placement system of IC design, comprising: an input module, a processing module and an output module. The input module receives component data and setting parameters, wherein the parameters include a crossover rate, a mutation rate and a termination condition. The processing module execute a genetic algorithm according to the setting parameters to randomly generate a plurality of populations, which are the zeroth-generation chromosome sequence, and each chromosome sequence is computed according to the component data to produce a plurality of computing values, and the computing value of each chromosome sequence is used for calculating the fitness value of the chromosome sequence, and the processing module repeats executing the genetic evolution to evolve the chromosome sequence to the next generation, selects one out of the chromosome sequences according to the fitness value of each chromosome sequence, determines whether or not to perform a crossover of the selected chromosome sequence according to the crossover rate to produce a plurality of sub-generation chromosome sequence, and determines whether or not to perform a mutation of each sub-generation chromosome sequence according to the mutation rate. The sub-generation chromosome sequence and its previous-generation chromosome sequence jointly constitute the next-generation populations (still a plurality of generations), and the genetic evolution is repeated until the termination condition is satisfied. Then, the processing module selects the best chromosome sequence from a plurality of chromosome sequences according to the fitness value of the population of each generation of each chromosome sequence, wherein the computing values include a positive and negative isotype rate of the placement components, and the positive and negative isotype rate= (Number of placement components−Number of positive and negative switches)/(Number of placement components).

The output module outputs the best placement method according to the best chromosome sequence.

Preferably, the computing values include a first computing value, a second computing value, and a third computing value, wherein:

The first computing value=(Total area of all placement components in a chip)/(Area of the chip);

The second computing value=(Ideal wire length of all placement components with an input and output relation)/(Actual wire length of all placement components with an input and output relation); and The third computing value=(Maximum of hot value generated by each hot zone)/(Total sum of hot values of all placement components).

Preferably, the processing module is also provided for executing a revised tree-structure methodology algorithm and controlling the quantity of chromosome sequences generated by the population of each generation according to the component data.

Preferably, the input module is also provided for inputting a limit condition so that the processing module executes the revised tree-structure methodology algorithm and controls the quantity of chromosome sequences generated by the population of each generation according to the component data and limit condition.

Preferably, the processing module further executes a local evolution procedure when the chromosome sequence of the population of each generation is generated so that each chromosome sequence generates a corresponding evolved chromosome sequence with a fitness value which is compared with the fitness value of each chromosome sequence, and if the fitness value of the corresponding evolved chromosome sequence is higher, then the evolved chromosome sequence will be added to the population and the chromosome sequence with a lower fitness value will be eliminated.

Preferably, when the chromosome sequence of the population of each generation is generated, the processing module further executes a roulette wheel algorithm to allocate a selection probability to each chromosome sequence according to the fitness value of each chromosome sequence, to select the chromosome sequence of the population of each generation, and to perform crossover and mutation of the selected chromosome sequence.

To achieve the forgoing objectives, the present invention further provides an automatic placement method of IC design comprising the steps of:

receiving component data and setting parameters through an input module, and the setting parameters including a crossover rate, a mutation rate and a termination condition;

executing a genetic algorithm according to the parameters by a processing module to randomly generate a plurality of populations, and the population being a plurality of zeroth-generation chromosome sequences;

calculating a plurality of computing values of each chromosome sequence through the processing module according to the component data to calculate a fitness value of each chromosome sequence from the computing values computed by each chromosome sequence, and the computing values including a first computing value, a second computing value, a third computing value and a positive and negative isotype rate, wherein:

the first computing value=(Total area of all placement components in a chip)/(Area of the chip);

the second computing value=(Ideal wire length of all placement components with an input and output relation)/(Actual wire length of all placement components with an input and output relation);

the third computing value=(Maximum of hot value generated by each hot zone)/(Total sum of hot values of all placement components); and the positive and negative isotype rate=(Number of placement components−Number of positive and negative switches)/(Number of placement components);

repeating executing a genetic evolution to evolve the chromosome sequence to the next generation by the processing module, selecting some of the chromosome sequences according to the fitness value of each chromosome sequence, determining whether or not to perform a crossover of the selected chromosome sequence according to the crossover rate to generate a plurality of sub-generation chromosome sequences, determining whether or not to perform a mutation of each sub-generation chromosome sequence according to the mutation rate, and repeating the genetic evolution of the next-generation population consisted of each sub-generation chromosome sequence and the chromosome sequence of a previous generation thereof until the termination condition is satisfied;

executing a local evolution procedure by the processing module to evolve each chromosome sequence into an evolved chromosome sequence, and comparing the fitness value of each chromosome sequence with the fitness value of the corresponding evolved chromosome sequence, and adding the evolved chromosome sequence into the population and eliminating the chromosome sequence with a smaller fitness value if the fitness value of the corresponding evolved chromosome sequence is greater;

executing a roulette wheel algorithm by the processing module to allocate a selection probability to each chromosome sequence according to the fitness value of each chromosome sequence, selecting the chromosome sequence in the population of each generation, and performing sequence crossover and mutation of the selected chromosome sequence, and repeating the roulette wheel algorithm until a sufficient quantity of chromosome sequences is selected;

selecting the best chromosome sequence from the chromosome sequences by the processing module according to the fitness value of each chromosome sequence of the population of each generation; and Outputting the best placement method according to the best chromosome sequence through an output module.

In summation, the automatic placement system and method of IC design of the present invention have one or more of the advantages:

(1) The automatic placement system and method of IC design can execute a genetic algorithm to select best placement method with smaller chip area, shorter wire length between the placement components, less heat consumption of the placement components and less positive and negative type switching of the placement components.

(2) The automatic placement system and method of IC design can adopt the revised tree-structure methodology algorithm and the roulette wheel algorithm to eliminate poor chromosome sequences in advance and control the predetermined quantity of chromosome sequences generated by the population of each generation, so as to achieve the effect of saving the computing time without affecting the system performance.

BRIEF DESCRIPTION OF THE DRAWINGS

The detailed structure, operating principle and effects of the present invention will now be described in more details hereinafter with reference to the accompanying drawings that show various embodiments of the invention as follows.

DETAILED DESCRIPTION OF THE PREFERRED EMBODIMENTS

Figure 1:
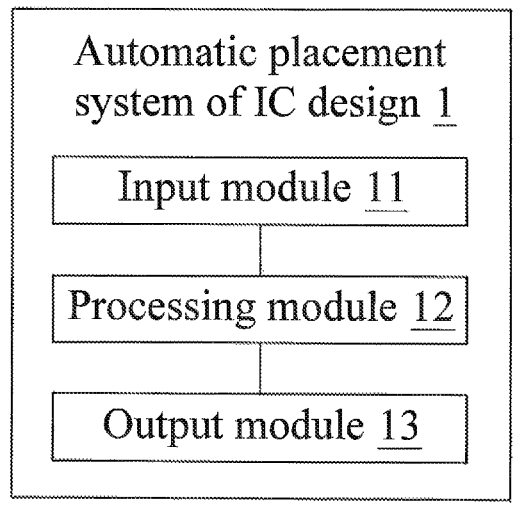
FIG. 1 is a block diagram of an automatic placement system of IC design of the present invention.

The technical content of the present invention will become apparent by the detailed description of the following embodiments and the illustration of related drawings as follows:

With reference to FIG. 1 for a block diagram of an automatic placement system of IC design of the present invention, the automatic placement system of IC design 1 comprises an input module 11, a processing module 12 and an output module 13. The input module 11 is provided for users to input component data and setting parameters. The component data include a component area, a heat value generated by the component or the type (P-type or N-type) of the component but not limited them. The setting parameters include a crossover rate and a mutation rate of the genetic algorithm and a termination condition (such as the number of generation populations) and the weighting values of each computing values of the fitness function but not limited them. The processing module 12 executes crossover and mutation of chromosome sequences by a selection mechanism according to an encode gene. The encode gene is represented by a binary code. Each chromosome is composed of three sections and each section has genes with the total quantity of the components. These three genes represent a sequence, an orientation, and a rotation, respectively. The selection mechanism includes a local evolution and a roulette wheel algorithm. The processing module 12 executes a genetic algorithm according to the component data and setting parameters inputted by user, and the output module 13 outputs the best method of the component placement according to the best chromosome sequence selected by the genetic algorithm. Wherein, detailed flow and the fitness function of the genetic algorithm are described below.

Figure 2:
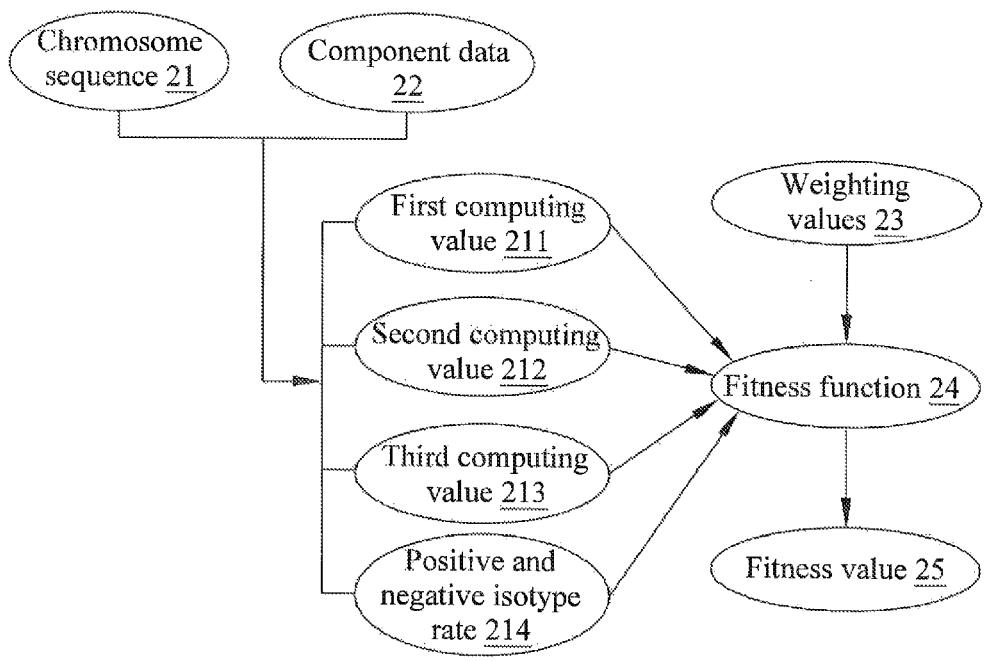
FIG. 2 is a first schematic view of an automatic placement system of IC design in accordance with a first preferred embodiment of the present invention.

With reference to FIG. 2 for the first schematic view of an automatic placement system of IC design in accordance with a first preferred embodiment of the present invention, the processing module executes a genetic algorithm, wherein the fitness function 24 of the genetic algorithm includes a first computing value 211, a second computing value 212, a third computing value 213 and a positive and negative isotype rate 214. The genetic algorithm generates plural generation populations, and the population of each generation includes a plurality of chromosome sequences 21, wherein the different chromosome sequences 21 represent the different methods of the component placement. After each chromosome sequence 21 is generated, the processing module calculates the first computing value 211, the second computing value 212, the third computing value 213 and the positive and negative isotype rate 214 of the corresponding chromosome sequence 21 according to the component data 22 and inputs them and their weighting values 23 to fitness function 24 to calculate a fitness value 25 of the chromosome sequence 21 according to the fitness function 24. In these chromosome sequences 21, the one with the greatest fitness value 25 is the best chromosome sequence. In other words, the corresponding placement method is the best placement method for circuit components.

Figure 3:
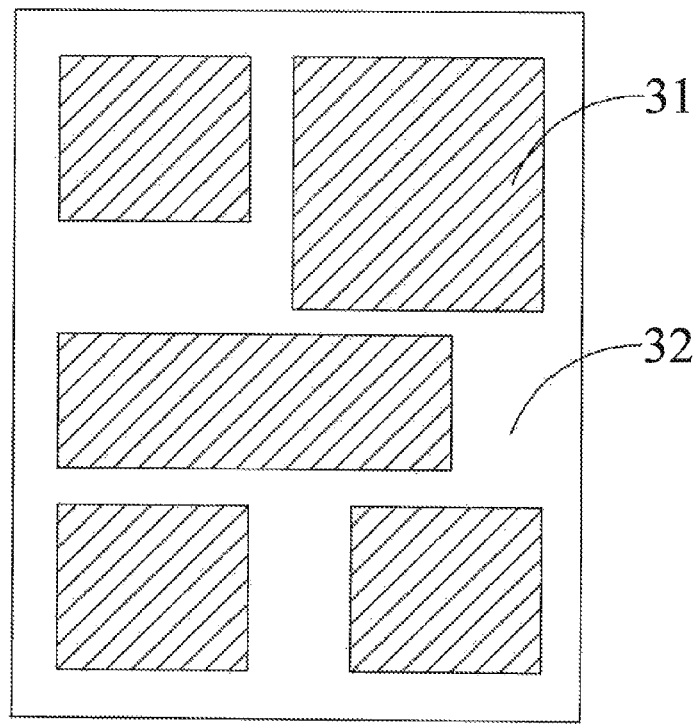
FIG. 3 is a second schematic view of an automatic placement system of IC design in accordance with the first preferred embodiment of the present invention.

The first, second and third computing values and the positive and negative isotype rate are described below. With reference to FIG. 3 for the second schematic view of an automatic placement system of IC design in accordance with the first preferred embodiment of the present invention, the first computing value=(Total area of all placement components in a chip)/(Area of the chip).

In FIG. 3, a placement component 31 is indicated by the shaded area in the figure, and a chip 32 is indicated by the square in the figure, and the first computing value is the ratio of the total sum of the shaded area to the area enclosed by the square and this value falls within a range between 0 and 1. The greater the first computing value, the closer the total area of all placement components 31 with respect to the area of the chip 32, or the higher the utility of the chip 32.

Figure 4A:
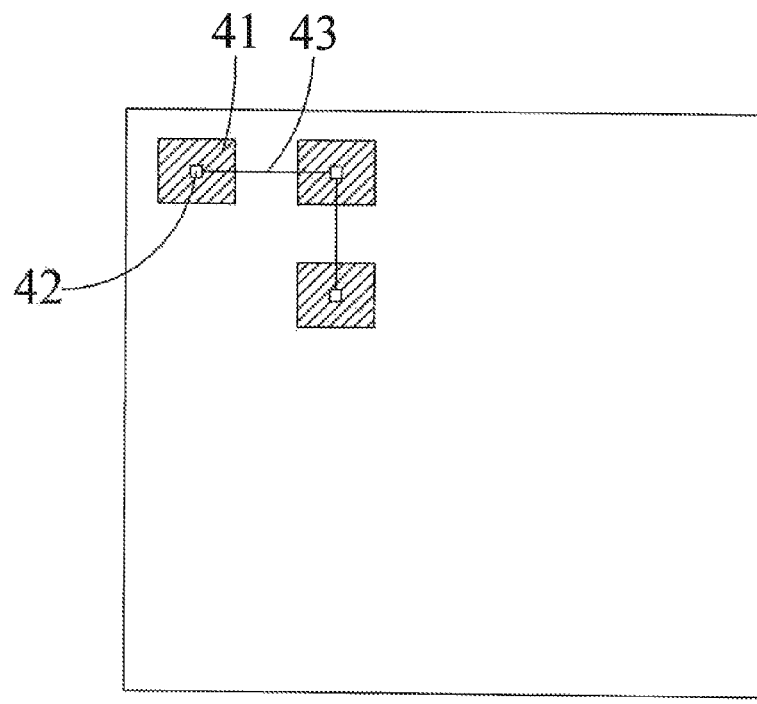
FIG. 4a is a third schematic view of an automatic placement system of IC design in accordance with the first preferred embodiment of the present invention.
Figure 4B:
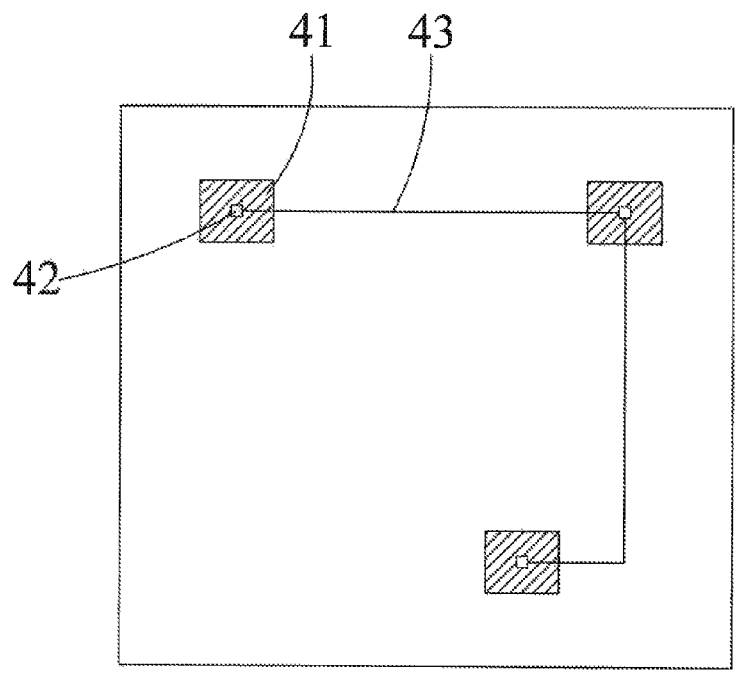
FIG. 4b is a fourth schematic view of an automatic placement system of IC design in accordance with the first preferred embodiment of the present invention.

With reference to FIGS. 4a and 4b for the third and fourth schematic views of an automatic placement system of IC design in accordance with the first preferred embodiment of the present invention, respectively. The second computing value=(Ideal wire length of all placement components with an input and output relation)/(Actual wire length of all placement components with an input and output relation).

In FIGS. 4a and 4b, the placement components 41 (such as indicated by the shaded area of the figures) have input and output relation with each other so that a wire 43 is required to connect a transmission port 42 of the placement component 41, and the placement components 41 can transmit data with one another. In FIG. 4a, the total wire length 43 is the ideal wire length 43. In other words, the wire 43 is connected to the transmission port 42 of each placement component by the shortest linear distance. However, the actual total wire length 43 is greater than the ideal wire length due to other placement factors in actual situations, as shown in FIG. 4b. The second computing value is the ratio of the ideal wire length 43 to the actual wire length 43 and falls within a range between 0 and 1. The grater the second computing value, the closer the actual wire length to the ideal wire length 43, or the shorter is the wire length 43.

Figure 5A:
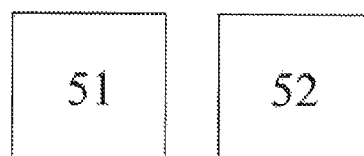
FIG. 5a is a fifth schematic view of an automatic placement system of IC design in accordance with the first preferred embodiment of the present invention.
Figure 5A:
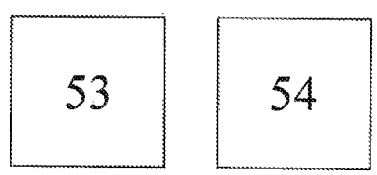
Figure 5B:
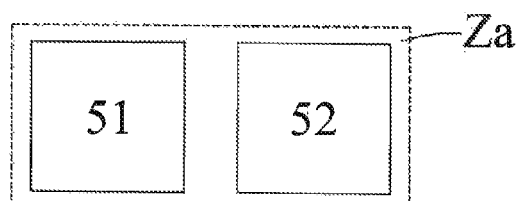
FIG. 5b is a sixth schematic view of an automatic placement system of IC design in accordance with the first preferred embodiment of the present invention.
Figure 5B:
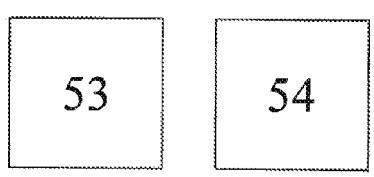
Figure 5C:
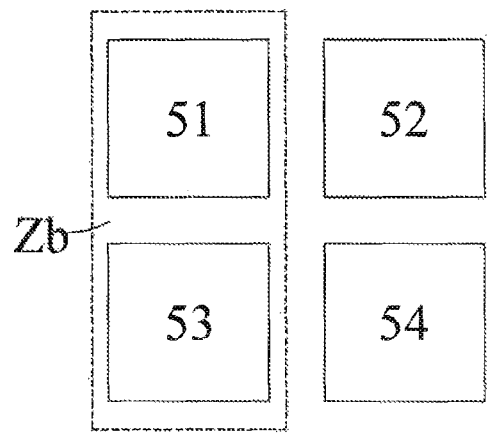
FIG. 5c is a seventh schematic view of an automatic placement system of IC design in accordance with the first preferred embodiment of the present invention.
Figure 5D:
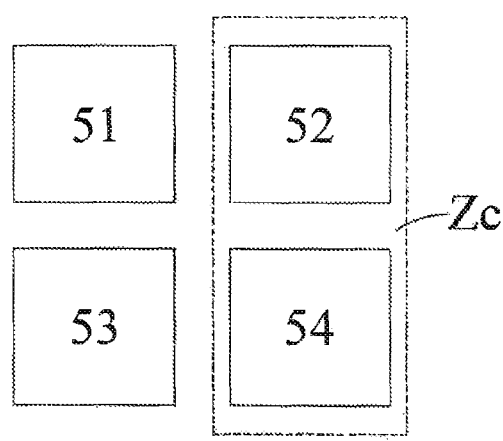
FIG. 5d is an eighth schematic view of an automatic placement system of IC design in accordance with the first preferred embodiment of the present invention.
Figure 5E:
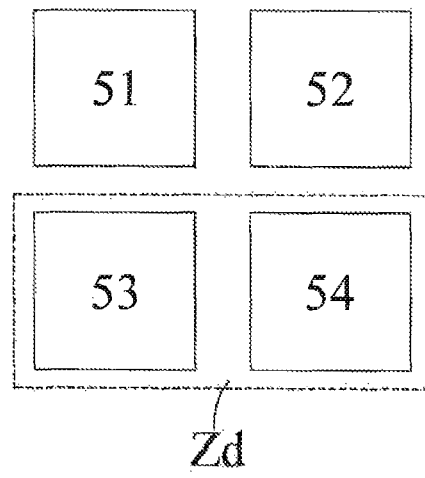
FIG. 5e is a ninth schematic view of an automatic placement system of IC design in accordance with the first preferred embodiment of the present invention.

With reference from FIGS. 5a to 5c for the fifth to the ninth schematic views of an automatic placement system of IC design in accordance with the first preferred embodiment of the present invention, respectively. The third computing value=(Maximum of hot value generated by each hot zone)/(Total sum of hot values of all placement components).

In FIG. 5a, the heat values generated by the placement components 51, 52, 53 and 54 are assumed to be H1, H2, H3 and H4, respectively. Then, the denominator of the third computing value is equal to H1+H2+H3+H4. In addition, a hot zone is formed between two adjacent placement components, as shown in FIGS. 5b to 5e, wherein a hot zone Za is formed between the placement components 51 and 52, a hot zone Zb is formed between the placement components 51 and 53, a hot zone Zc is formed between the placement components 52 and

54, and a hot zone Zd is formed between the placement components 53 and 54. Assumed that the heat values generated by the hot zones Za, Zb, Zc and Zd are Ha, Hb, He and Hd, respectively. Then, the numerator of the third computing value is the largest one of Ha, Hb, He and Hd. The smaller the third computing value, the largest the heat value generated by each hot zone in the component placement method, or the better average of the heat values generated by each hot zone, or the smaller third computing value. In other words, the smaller the total heat value of the placement components, the better the chip performance.

More specifically, a hot zone is formed between two adjacent placement components, and the hot zone formed between two components with a greater heat value generates a grater heat value. In a component placement, components with greater heat values should not be placed next to each other to avoid a too-large heat value generated by the hot zone. In other words, if two components with large heat values are placed next to each other, the heat value generated by the hot zone may be also greater so that the total heat value of the chip is greater. As a result, a greater heat noise may reduce the chip performance. Therefore, components with a greater heat value should be separated from one another in the placement component process.

Figure 6A:
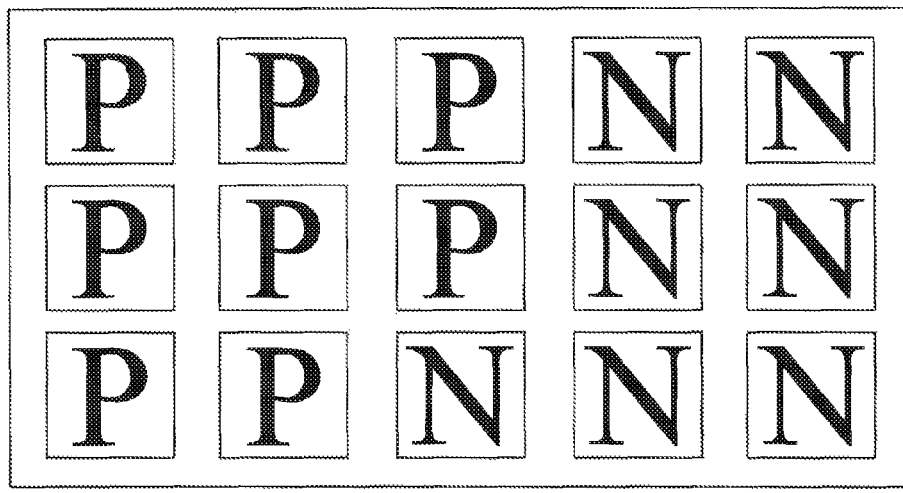
FIG. 6a is a tenth schematic view of an automatic placement system of IC design in accordance with the first preferred embodiment of the present invention.
Figure 6B:
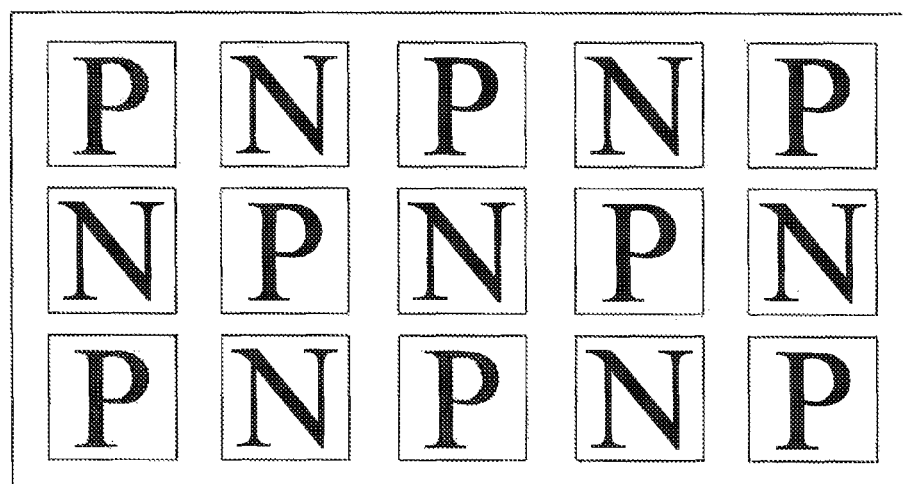
FIG. 6b is an eleventh schematic view of an automatic placement system of IC design in accordance with the first preferred embodiment of the present invention.

With reference to FIGS. 6a and 6b for the tenth to the eleventh schematic views of an automatic placement system of IC design in accordance with the first preferred embodiment of the present invention, respectively. The positive and negative isotype rate=(Number of placement components−Number of positive and negative switches)/(Number of placement components).

All placement components can be divided into P-type and N-type, wherein the PMOS transistor is classified as P-type and NMOS transistor is classified as N-type, and most of the resistors and capacitors are connected to a substrate and thus are classified as N-type. If two placement components placed to each other are the different types, the number of positive and negative switches will be increased by 1. On the other hand, if two placement components are the same type, then the number of positive and negative switches will remain unchanged. The positive and negative switching between the placement components results in a greater noise so that an ideal placement method should arrange two placement components of the same type together, as shown in FIG. 6a. Conversely, the placement method makes them to produce noises between the placement components and results in a lower chip performance, as shown in FIG. 6b. The positive and negative isotype rate is the reciprocal of the positive and negative switching rate of the placement components. It falls within a range between 0 and 1. The smaller the number of positive and negative switches of the placement component, the greater the positive and negative isotype rate or the less the noises produced.

When the processing module calculates the first to the third computing values and the positive and negative isotype rate, the processing module computes a fitness function, which a combination of the first to the third computing values multiplied their weighting values, respectively. These weighting values can be set by setting parameters. Therefore, the processing module calculates the fitness value of the corresponding chromosome sequence. After the genetic algorithm generates the chromosome sequence of the population of each generation, it calculates the fitness values of all chromosome sequence of the population of that generation and selects a sufficient number of individuals to perform sequence crossover and mutation to generate a chromosome sequence of the population of the next generation. This process is a prior art so that it will not be described here. The aforementioned process will be repeated until the number of generation populations of the chromosome sequence is equal to the number of generation populations set in the setting parameters. And then, the processing module selects a chromosome sequence with the greatest fitness value from all chromosome sequences as the best chromosome sequence and transmits the best chromosome sequence to the output module, and the output module outputs the best placement method according to the chromosome sequence.

Figure 7A:
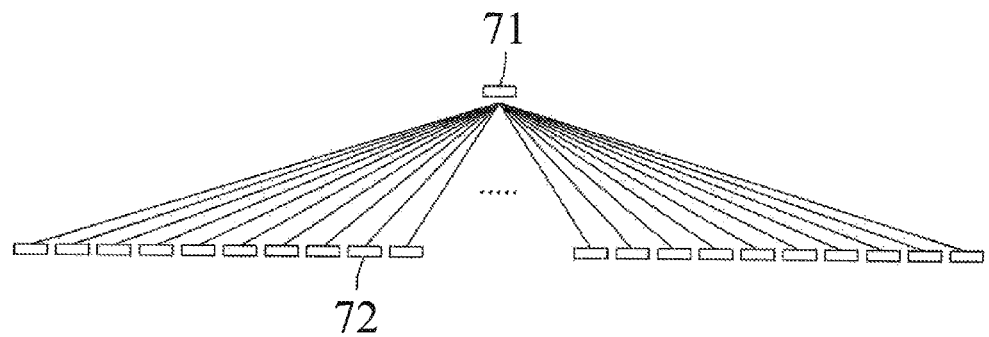
FIG. 7a is a first schematic view of an automatic placement system of IC design in accordance with a second preferred embodiment of the present invention.
Figure 7B:
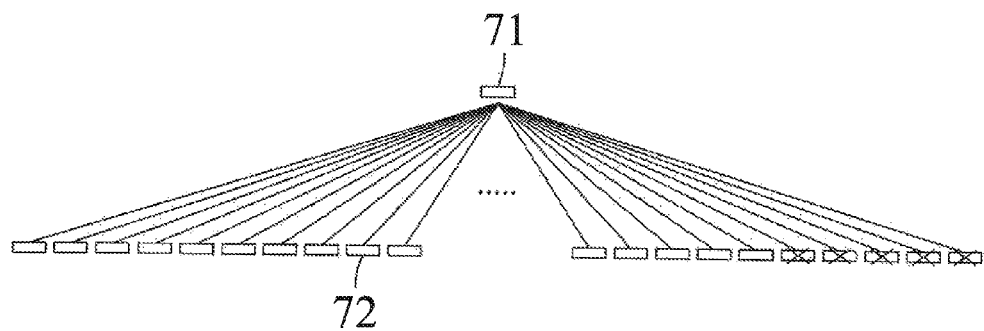
FIG. 7b is a second schematic view of an automatic placement system of IC design in accordance with the second preferred embodiment of the present invention.

With reference from FIGS. 7a to 7e for the first to the fifth schematic views of an automatic placement system of IC design in accordance with a second preferred embodiment of the present invention, respectively. The process of the second preferred embodiment is substantially the same as the first preferred embodiment of the present invention, and thus in this description will be not repeated, and only a certain generation population generated by the sequence crossover and mutation of chromosome sequence is analyzed. In the process of the genetic algorithm, a father-generation chromosome sequence 71 generates a plurality of sub-generation chromosome sequences 72, as shown in FIG. 7a. Since the quantities of sub-generation chromosome sequences 72 are very large, so it will take lots of time to calculate the fitness values for the sequence crossover and mutation. Therefore, the processing module will execute a revised tree-structure methodology algorithm which sets a conditional limitation for the sequence crossover and mutation in the genetic algorithm to control the number of sub-generation chromosome sequences 72 generated by the sequence crossover and mutation, as shown in FIG. 7b. In other words, the revised tree-structure methodology algorithm can filter the sub-generation chromosome sequence 72 that may have a good fitness value during the sequence crossover and mutation in advance in order to reduce the quantity of sub-generation chromosome sequences 72 generated by the population of each generation without affecting the final selection of the best placement method and expedite the system computation.

Figure 7C:
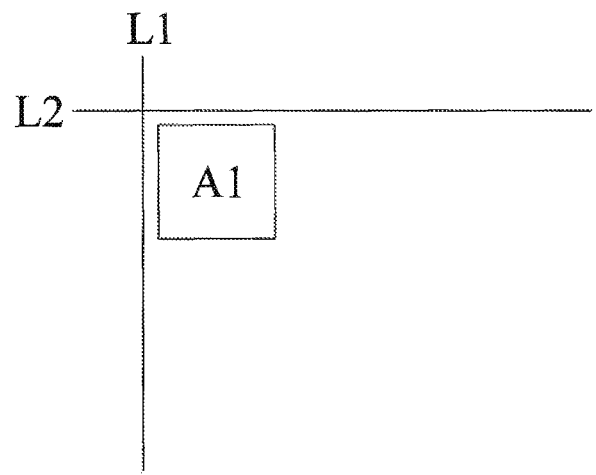
FIG. 7c is a third schematic view of an automatic placement system of IC design in accordance with the second preferred embodiment of the present invention.

In FIG. 7c, the conditional limitation of the revised tree-structure methodology algorithm satisfied that the limitation of placing the placement components not both beyond the top of the straight line L1 and the left of the straight line L2 of the first placement component A1 in the component displacement process, and the placement components cannot be overlapped with each other.

Figure 7D:
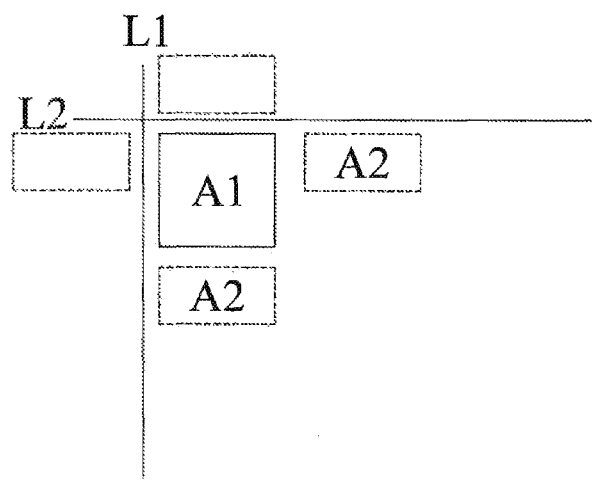
FIG. 7d is a fourth schematic view of an automatic placement system of IC design in accordance with the second preferred embodiment of the present invention.
Figure 7E:
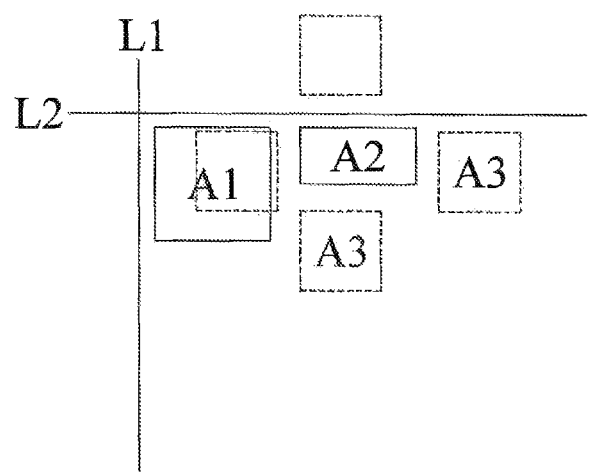
FIG. 7e is a fifth schematic view of an automatic placement system of IC design in accordance with the second preferred embodiment of the present invention.

In FIG. 7d, after the placement component A1 is placed, the placement component A2 can be placed at four positions including the top, the bottom, the left side and the right side of the placement component A1. However, if the placement component A2 is placed at the top of the placement component A1, the position of the placement component A2 will be beyond the top of the straight line L1. In addition, if the placement component A2 is placed on the left side of the placement component A1, the position of the placement component A2 will be beyond the left side of the straight line L2. In FIG. 7d, when the revised tree-structure methodology algorithm is executed, the placement component A2 can be placed on the right side or at the bottom of the placement component A1 xonly. In FIG. 7e, the placement component A2 placed on the right side of the placement component A1 is analyzed. In FIG. 7e, after the placement component A2 is placed, the placement component A3 can be placed at four positions including the top, the bottom, the left side and the right side of the placement component A2. However, if the placement component A3 is placed on the left side of the placement component A2, the placement component A3 and the placement component A1 will be overlapped. In addition, if the placement component A3 is placed at the top of the placement component A2, the placement component A3 will be beyond the top of the straight line L1. Therefore, when the revised tree-structure methodology algorithm is executed, the placement component A3 can be placed at the right side or the bottom of the placement component A2 only when the placement component A2 is placed at the right side of the first placement component A1

In other words, if the revised tree-structure methodology algorithm is executed, any placement component is placed at a position beyond the top of the straight line L1 or the left side of the straight line L2 of the corresponding placement method or the positions of any two placement components are overlapped when the sub-generation chromosome sequence 72 is generated, then the processing module will eliminate the sub-generation chromosome sequence 72 directly. In other words, the eliminated chromosome sequence 72 will not execute the follow-up process of the genetic algorithm.

It is noteworthy that the conditional limitation of the revised tree-structure methodology algorithm includes the consideration that all transistors must be operated in a saturated region but not limited it.

Figure 8A:
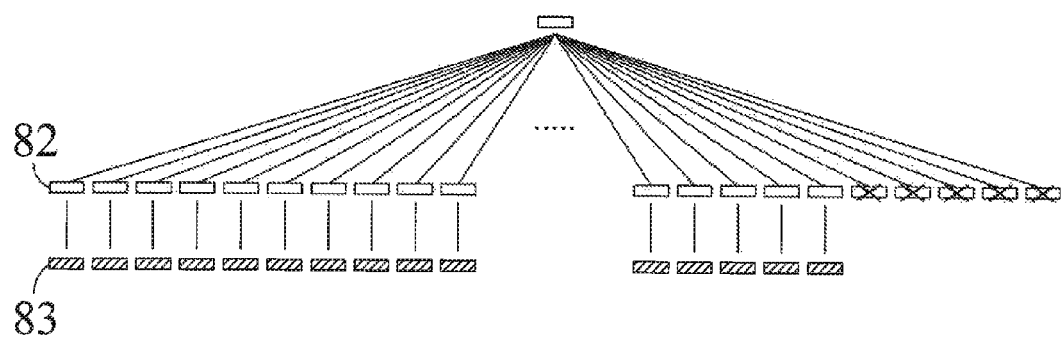
FIG. 8a is a sixth schematic view of an automatic placement system of IC design in accordance with the second preferred embodiment of the present invention.
Figure 8B:
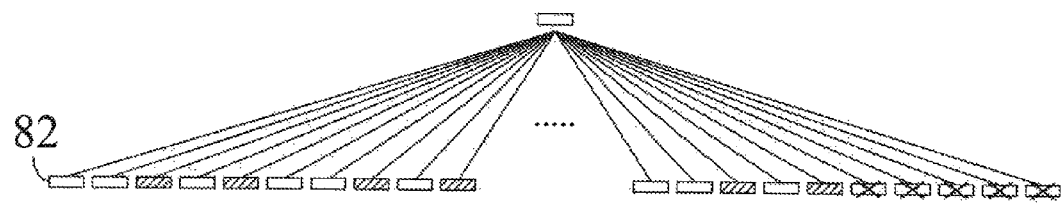
FIG. 8b is a seventh schematic view of an automatic placement system of TC design in accordance with the second preferred embodiment of the present invention.

With reference to FIGS. 8a and 8b for the sixth and the seventh schematic views of an automatic placement system of IC design in accordance with the second preferred embodiment of the present invention, respectively. After the processing module eliminates the bad sub-generation chromosome sequences by the revised tree-structure methodology algorithm, as shown in FIG. 8a. The processing module further executes a local evolution process to improve the performance of each sub-generation chromosome. The local evolution process randomly selects the sub-generation chromosome sequence 82 by a local search method, and the selected sub-generation chromosome sequence 82 is switched randomly orientation or rotation gene so that the selected sub-generation chromosome sequence 82 can generate its corresponding evolved chromosome sequence 83, and then fitness values of the selected chromosome sequence 82 and its corresponding evolved chromosome sequence 83 are compared each other, as shown in FIG. 8b. If the fitness value of the corresponding evolved chromosome sequence 83 is greater, then the evolved chromosome sequence 83 will be added into the population and the chromosome sequence with a smaller fitness value will be eliminated. More specifically, the processing module executes the local evolution process to generate the corresponding evolved chromosome sequence 83 from the selected sub-generation chromosome sequence 92 and eliminates the one with a smaller fitness value of the two so as to improve the fitness value of the chromosome sequence entered into the follow-up process of the genetic algorithm. Thus, it can improve the quality of the chromosome sequence at a follow-up process of the genetic algorithm.

Figure 9A:
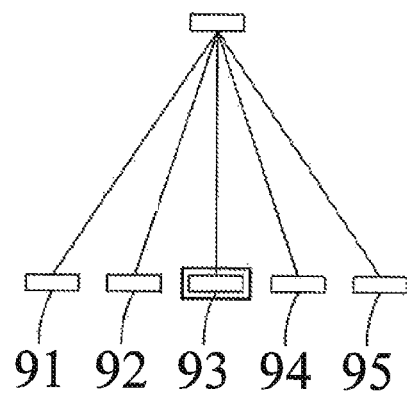
FIG. 9a is an eighth schematic view of an automatic placement system of IC design in accordance with the second preferred embodiment of the present invention.
Figure 9B:
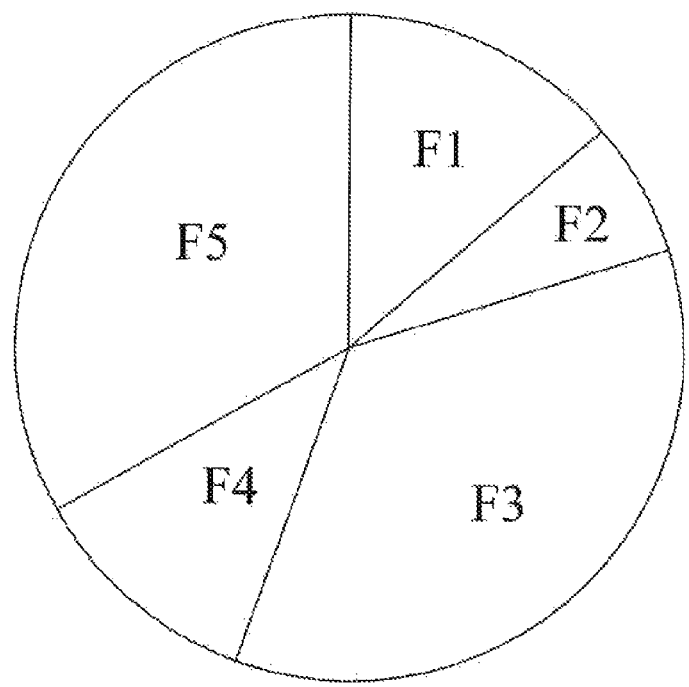
FIG. 9b is a ninth schematic view of an automatic placement system of IC design in accordance with the second preferred embodiment of the present invention.

With reference to FIGS. 9a and 9b for the eighth and the ninth schematic views of an automatic placement system of IC design in accordance with the second preferred embodiment of the present invention, respectively. After the processing module executes the revised tree-structure methodology algorithm and the local evolution process to select the sub-generation chromosome sequence, a roulette wheel algorithm can be executed to randomly select a sub-generation chromosome sequence, as shown in FIG. 9a. The selected sub-generation chromosome sequence and the father-generation chromosome sequence are performed the sequence crossover and mutation. In FIG. 9b, the roulette wheel algorithm determines the probability of each sub-generation chromosome sequence being selected according to the fitness value of each sub-generation chromosome sequence. Five sub-generation chromosome sequences are used as an example. If the fitness values of the sub-generation chromosome sequences 91, 92, 93, 94 and 95 are F1, F2, F3, F4 and F5, respectively. Then, the probability of the sub-generation chromosome sequence 91 being selected by the roulette wheel algorithm will be equal to F1/(F1+F2+F3+F4+F5), and the probability of the sub-generation chromosome sequence 92 being selected will be equal to F2/(F1+F2+F3+F4+F5), and so forth. In other words, the greater the fitness values of the sub-generation chromosome sequence, the greater the probability of being selected, or the better chance of selecting a better chromosome sequence.

It is noteworthy that the roulette wheel algorithm does not limit the quantity of the selected sub-generation chromosome sequence for each generation to one only. In other words, the roulette wheel algorithm can select a plurality of better sub-generation chromosome sequences according to the fitness value of the sub-generation chromosome sequence. This process will be repeated until a sufficient quantity of sub-generation chromosome sequences is selected.

Briefly, the roulette wheel algorithm can ensure the quality of the generated chromosome sequences to a certain extent.

Even though the concept of the automatic placement method of IC design of the present invention has been described in the section of the automatic placement system of IC design of the present invention, the following flow chart is further provided for illustrating the concept of the method more clearly.

Figure 10A:
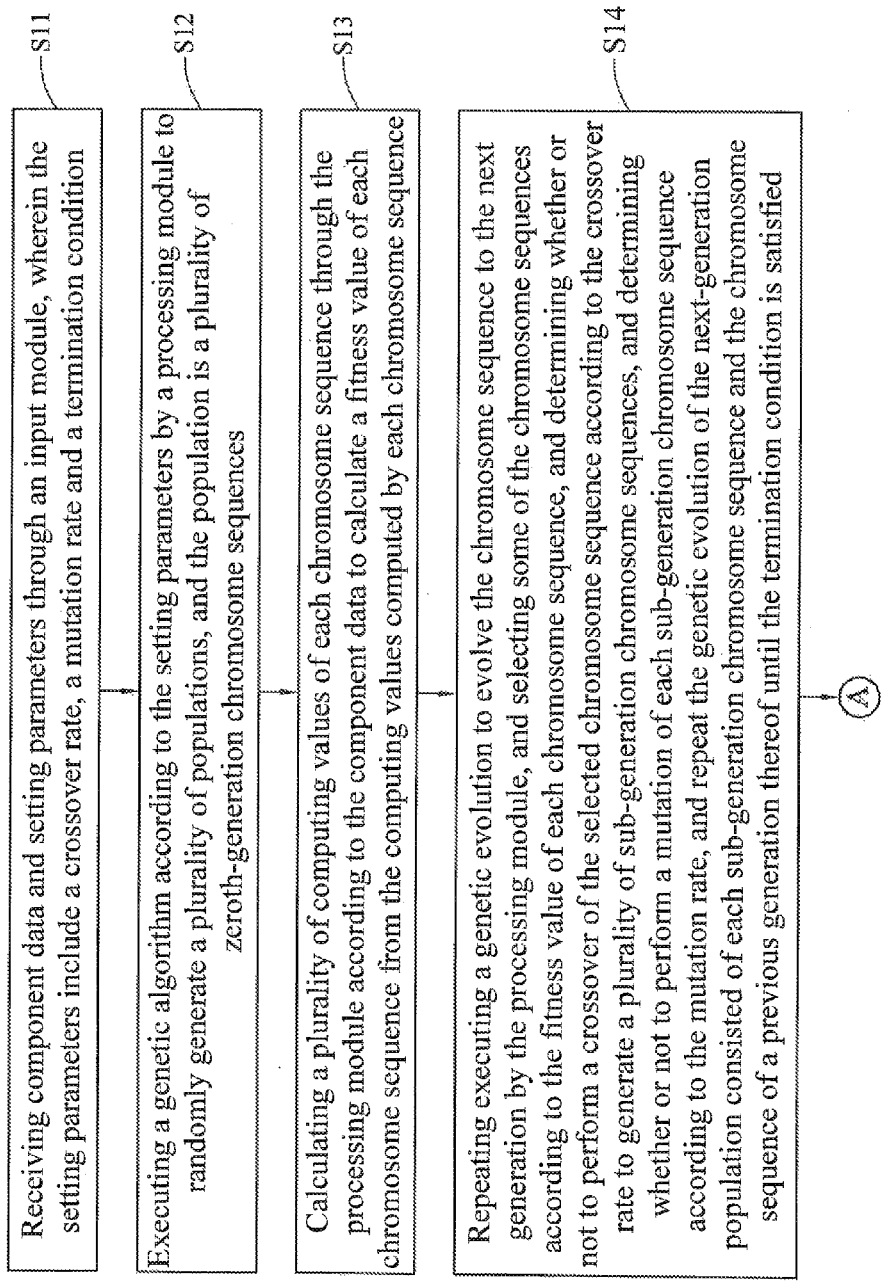
FIGS. 10a and 10b are flow charts of an automatic placement method of IC design of the present invention.
Figure 10B:
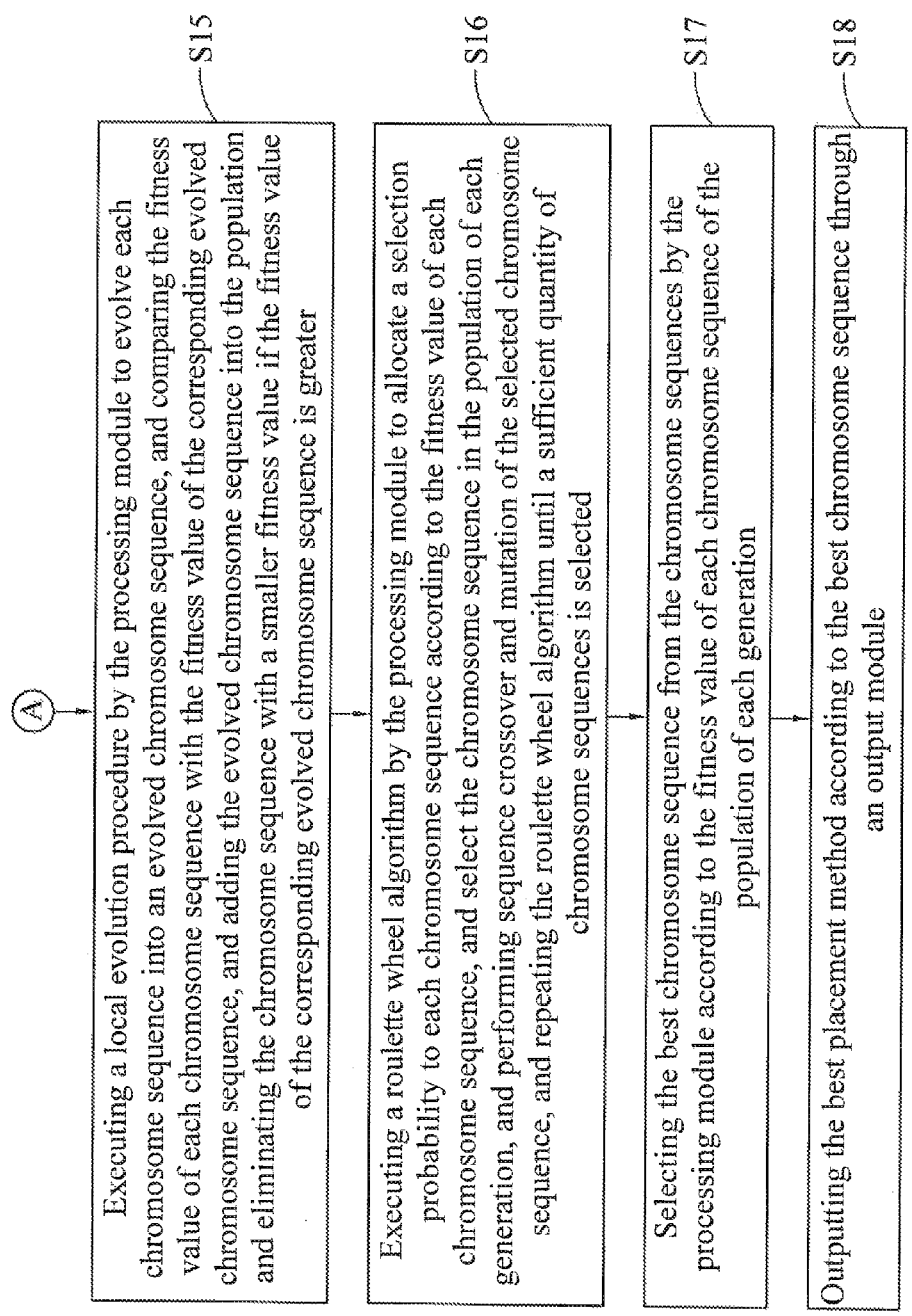

With reference to FIGS. 10a and 10b for flow charts of an automatic placement method of IC design of the present invention, the automatic placement method of IC design comprises the following steps:

S11: Receiving component data and setting parameters through an input module, wherein the setting parameters includes a crossover rate, a mutation rate and a termination condition.

S12: Executing a genetic algorithm according to the setting parameters by a processing module to randomly generate a plurality of populations, and the population is a plurality of zeroth-generation chromosome sequences.

S13: Calculating a plurality of computing values of each chromosome sequence through the processing module according to the component data to calculate a fitness value of each chromosome sequence from the computing values computed by each chromosome sequence. Wherein, the computing values include a first computing value, a second computing value, a third computing value and a positive and negative isotype rate, wherein:

The first computing value=(Total area of all placement components in a chip)/(Area of the chip).

The second computing value=(Ideal wire length of all placement components with an input and output relation)/(Actual wire length of all placement components with an input and output relation).

The third computing value=(Maximum of hot value generated by each hot zone)/(Total sum of hot values of all placement components).

The positive and negative isotype rate=(Number of placement components−Number of positive and negative switches)/(Number of placement components).

S14: Repeating executing a genetic evolution to evolve the chromosome sequence to the next generation by the processing module, and selecting some of the chromosome sequences according to the fitness value of each chromosome sequence, and determining whether or not to perform a crossover of the selected chromosome sequence according to the crossover rate to generate a plurality of sub-generation chromosome sequences, and determining whether or not to perform a mutation of each sub-generation chromosome sequence according to the mutation rate, and repeating the genetic evolution of the next-generation population consisted of each sub-generation chromosome sequence and the chromosome sequence of a previous generation thereof until the termination condition is satisfied.

S15: Executing a local evolution procedure by the processing module to evolve each chromosome sequence into an evolved chromosome sequence, and comparing the fitness value of each chromosome sequence with the fitness value of the corresponding evolved chromosome sequence, and adding the evolved chromosome sequence into the population and eliminating the chromosome sequence with a smaller fitness value if the fitness value of the corresponding evolved chromosome sequence is greater.

S16: Executing a roulette wheel algorithm by the processing module to allocate a selection probability to each chromosome sequence according to the fitness value of each chromosome sequence, and selecting the chromosome sequence in the population of each generation, and performing sequence crossover and mutation of the selected chromosome sequence, and repeating the roulette wheel algorithm until a sufficient quantity of chromosome sequences is selected.

S17: Selecting the best chromosome sequence from the chromosome sequences by the processing module according to the fitness value of each chromosome sequence of the population of each generation.

S18: Outputting the best placement method according to the best chromosome sequence through an output module.

The details and implementation method of the automatic placement method of IC design of the present invention have been described in the section of the automatic placement system of IC design of the present invention, and thus this description will not be repeated.

In summation of the description above, the automatic placement system and method of IC design of the present invention execute a genetic algorithm to select the best placement method with a smaller chip area, a shorter wire length between the placement components, less heat consumption of the placement components and less switching number of positive and negative type switches of the placement components by using a fitness function, and further adopts a revised tree-structure methodology algorithm and a roulette wheel algorithm to achieve the effect of saving the computing time without affecting the system performance.

While the means of specific embodiments in present invention has been described by reference drawings, numerous modifications and variations could be made thereto by those skilled in the art without departing from the scope and spirit of the invention set forth in the claims. The modifications and variations should in a range limited by the specification of the present invention.

What is claimed is:

1. An automatic placement system of IC design, comprising:
an input module, for receiving component data and setting parameters, the setting parameters including a crossover rate, a mutation rate and a termination condition;
a processing module, for executing a genetic algorithm according to the setting parameter to randomly generate a plurality of populations, the populations being a plurality of zeroth-generation chromosome sequences, computing a plurality of computing values of each of the chromosome sequences according to the component data, computing a fitness value of each chromosome sequence from the computed computing values of each chromosome sequence, evolving the chromosome sequence into a next generation genetic evolution repeatedly, selecting some of the chromosome sequences according to the fitness value of each chromosome sequence, determining whether or not to perform a crossover of the selected chromosome sequence according to the crossover rate to produce a plurality of sub-generation chromosome sequences, determining whether or not to perform a mutation of each sub-generation chromosome sequence according to the mutation rate, each of the sub-generation chromosome sequences and the chromosome sequence of a previous generation jointly constituting a next generation population, and the genetic evolution being executed repeatedly until the termination condition is satisfied, and the processing module selecting the best chromosome sequence from the chromosome sequences according to the fitness value of each chromosome sequence of the population of each generation, and the computing values including a positive and negative isotype rate which is equal to (Number of placement components−Number of positive and negative switches)/(Number of placement components); and
an output module, for outputting a best placement method according to the best chromosome sequence.

2. The automatic placement system of IC design according to claim 1, wherein the computing values further include a first computing value, a second computing value and a third computing value, and
the first computing value=(Total area of all placement components in a chip)/(Area of the chip);
the second computing value=(Ideal wire length of all placement components with an input and output relation)/(Actual wire length of all placement components with an input and output relation); and
the third computing value=(Maximum of hot value generated by each of a plurality of hot zones)/(Total sum of hot values of all placement components);
wherein the plurality of hot zones are formed between two adjacent placement components, respectively.

3. The automatic placement system of IC design according to claim 1, wherein the processing module further executes a revised tree-structure methodology algorithm to control the quantity of chromosome sequences generated by the population of each generation according to the component data.

4. The automatic placement system of IC design according to claim 3, wherein the input module further inputs a limit condition so that the revised tree-structure methodology algorithm executed by the processing module controls the quantity of chromosome sequences generated by the population of each generation according to the component data and the limit condition.

5. The automatic placement system of IC design according to claim 1, wherein when the chromosome sequence of the population of each generation is produced, the processing module further executes a local evolution procedure so that each chromosome sequence generates a corresponding evolved chromosome sequence with a fitness value which is compared with the fitness value of each chromosome sequence, and if the fitness value of the corresponding evolved chromosome sequence is higher, then the evolved chromosome sequence will be added to the population and the chromosome sequence with a lower fitness value will be eliminated.

6. The automatic placement system of IC design according to claim 1, wherein when the chromosome sequence of the population of each generation is generated, the processing module further executes a roulette wheel algorithm to allocate a selection probability to each chromosome sequence according to the fitness value of each chromosome sequence, select the chromosome sequence of the population of each generation, and perform crossover and mutation of the selected chromosome sequence.

7. An automatic placement method of IC design, comprising the steps of:
  receiving component data and setting parameters through an input module, the setting parameters including a crossover rate, a mutation rate and a termination condition;
  executing a genetic algorithm according to the setting parameters by a processing module to randomly generate a plurality of populations, and a population being a plurality of zeroth-generation chromosome sequences;
  calculating a plurality of computing values of each chromosome sequence through the processing module according to the component data to calculate a fitness value of each chromosome sequence from the computing values computed by each chromosome sequence, the computing values including a first computing value, a second computing value, a third computing value and a positive and negative isotype rate, wherein:
  the first computing value=(Total area of all placement components in a chip)/(Area of the chip);
  the second computing value=(Ideal wire length of all placement components with an input and output relation)/(Actual wire length of all placement components with an input and output relation);
  the third computing value=(Maximum of hot value generated by each of a plurality of hot zones)/(Total sum of hot values of all placement components); and
  the positive and negative isotype rate=(Number of placement components−Number of positive and negative switches)/(Number of placement components);
  repeatedly executing a genetic evolution to evolve the chromosome sequence to the next generation by the processing module, selecting some of the chromosome sequences according to the fitness value of each chromosome sequence, determining whether or not to perform a crossover of the selected chromosome sequence according to the crossover rate to generate a plurality of sub-generation chromosome sequences, determining whether or not to perform a mutation of each sub-generation chromosome sequence according to the mutation rate, and repeating the genetic evolution of the next-generation population consisting of each sub-generation chromosome sequence and the chromosome sequence of a previous generation thereof until the termination condition is satisfied;
  executing a local evolution procedure by the processing module to evolve each chromosome sequence into an evolved chromosome sequence, and comparing the fitness value of each chromosome sequence with the fitness value of the corresponding evolved chromosome sequence, and adding the evolved chromosome sequence into the population and eliminating the chromosome sequence with a smaller fitness value if the fitness value of the corresponding evolved chromosome sequence is greater;
  executing a roulette wheel algorithm by the processing module to allocate a selection probability to each chromosome sequence according to the fitness value of each chromosome sequence, selecting the chromosome sequence in the population of each generation, and performing sequence crossover and mutation of the selected chromosome sequence, and repeating the roulette wheel algorithm until a sufficient quantity of chromosome sequences is selected;
  selecting the best chromosome sequence from the chromosome sequences by the processing module according to the fitness value of each chromosome sequence of the population of each generation; and
  outputting a best placement method according to the best chromosome sequence through an output module;
  wherein the plurality of hot zones are formed between two adjacent placement components, respectively.

8. The automatic placement method of IC design according to claim 7, further comprising the step of executing a revised tree-structure methodology algorithm through the processing module to control the quantity of chromosome sequences generated by the population of each generation according to the component data.

9. The automatic placement method of IC design according to claim 7, further comprising the step of inputting a limit condition through the input module so that a revised tree-structure methodology algorithm executed by the processing module controls the quantity of chromosome sequences generated by the population of each generation according to the component data and the limit condition.

* * * * *